(12) United States Patent
Zhou et al.

(10) Patent No.: US 11,855,408 B2
(45) Date of Patent: Dec. 26, 2023

(54) LASER SYSTEMS UTILIZING FIBER BUNDLES FOR POWER DELIVERY AND BEAM SWITCHING

(71) Applicants: Wang-Long Zhou, Andover, MA (US); Bien Chann, Merrimack, NH (US); Francisco Villarreal-Saucedo, Middleton, MA (US); Parviz Tayebati, Sherborn, MA (US)

(72) Inventors: Wang-Long Zhou, Andover, MA (US); Bien Chann, Merrimack, NH (US); Francisco Villarreal-Saucedo, Middleton, MA (US); Parviz Tayebati, Sherborn, MA (US)

(73) Assignee: Panasonic Connect North America, Division of Panasonic Corporation of North America, Newark, NJ (US)

( * ) Notice: Subject to any disclaimer, the term of this patent is extended or adjusted under 35 U.S.C. 154(b) by 12 days.

(21) Appl. No.: 18/084,695

(22) Filed: Dec. 20, 2022

(65) Prior Publication Data
US 2023/0119937 A1    Apr. 20, 2023

Related U.S. Application Data

(63) Continuation of application No. 17/140,293, filed on Jan. 4, 2021, now Pat. No. 11,563,301, which is a
(Continued)

(51) Int. Cl.
*H01S 5/00*     (2006.01)
*G02B 6/42*     (2006.01)
(Continued)

(52) U.S. Cl.
CPC ........ *H01S 5/0071* (2013.01); *B23K 26/0643* (2013.01); *G02B 6/03633* (2013.01);
(Continued)

(58) Field of Classification Search
CPC .... H01S 5/0071; H01S 5/4012; H01S 5/4093; B23K 26/0643; G02B 6/03633; G02B 6/04; G02B 6/4206; G02B 6/4214
(Continued)

(56) References Cited

U.S. PATENT DOCUMENTS 5,742,722 A    4/1998  Imoto
6,266,467 B1   7/2001  Kato et al.
(Continued)

FOREIGN PATENT DOCUMENTS

EP    0798067 A1    1/1997

OTHER PUBLICATIONS

PCT International Patent Application No. PCT/US2017/060760, International Search Report and Written Opinion dated Mar. 9, 2018, 17 pages.

*Primary Examiner* — Jerry M Blevins
(74) *Attorney, Agent, or Firm* — Morgan, Lewis & Bockius LLP

(57) ABSTRACT

In various embodiments, the beam parameter product and/or beam shape of a laser beam is adjusted by coupling the laser beam into an optical fiber of a fiber bundle and directing the laser beam onto one or more in-coupling locations on the input end of the optical fiber. The beam emitted at the output end of the optical fiber may be utilized to process a workpiece.

20 Claims, 7 Drawing Sheets

Related U.S. Application Data continuation of application No. 16/816,564, filed on Mar. 12, 2020, now Pat. No. 10,916,911, which is a continuation of application No. 16/245,349, filed on Jan. 11, 2019, now Pat. No. 10,630,047, which is a continuation of application No. 15/807,795, filed on Nov. 9, 2017, now Pat. No. 10,224,691.

(60) Provisional application No. 62/429,270, filed on Dec. 2, 2016.

(51) Int. Cl.
    *G02B 6/35*      (2006.01)
    *B23K 26/06*      (2014.01)
    *G02B 6/036*      (2006.01)
    *G02B 6/04*      (2006.01)
    *H01S 5/40*      (2006.01)

(52) U.S. Cl.
CPC ................ *G02B 6/04* (2013.01); *G02B 6/35* (2013.01); *G02B 6/4206* (2013.01); *G02B 6/4214* (2013.01); *G02B 6/4296* (2013.01); *G02B 6/03611* (2013.01); *G02B 6/03627* (2013.01); *G02B 6/3512* (2013.01); *H01S 5/4012* (2013.01); *H01S 5/4093* (2013.01)

(58) Field of Classification Search
USPC .......................................................... 385/31
See application file for complete search history.

(56) References Cited

U.S. PATENT DOCUMENTS

| | | | |
|---|---|---|---|
| 6,473,383 B1 | 10/2002 | Durnin et al. | |
| 7,085,463 B2 | 8/2006 | Takahashi et al. | |
| 7,603,015 B2 | 10/2009 | Bickham et al. | |
| 7,957,432 B2 | 6/2011 | Chann et al. | |
| 8,773,755 B2 | 7/2014 | Nishihara et al. | |
| 8,781,269 B2 | 7/2014 | Huber et al. | |
| 9,063,289 B1 * | 6/2015 | Farmer | G02B 6/2821 |
| 9,166,365 B2 | 10/2015 | Park et al. | |
| 9,250,390 B2 | 2/2016 | Muendel et al. | |
| 9,482,821 B2 | 11/2016 | Huber et al. | |
| 10,088,632 B2 | 10/2018 | Zhou et al. | |
| 10,224,691 B2 | 3/2019 | Zhou et al. | |
| 10,281,656 B2 | 5/2019 | Huber et al. | |
| 10,401,562 B2 | 9/2019 | Villarreal-Saucedo et al. | |
| 10,630,047 B2 | 4/2020 | Zhou et al. | |
| 10,916,911 B2 | 2/2021 | Zhou et al. | |
| 2002/0094181 A1 | 7/2002 | Bhagavatula | |
| 2003/0016441 A1 | 1/2003 | Leplingard et al. | |
| 2004/0146295 A1 | 7/2004 | Furman et al. | |
| 2005/0175309 A1 | 8/2005 | Seo et al. | |
| 2005/0180707 A1 | 8/2005 | Furman et al. | |
| 2008/0173392 A1 | 7/2008 | Tanaka et al. | |
| 2011/0142083 A1 | 6/2011 | Tanigawa et al. | |
| 2012/0105968 A1 | 5/2012 | Chann et al. | |
| 2013/0218321 A1 | 8/2013 | Miyamoto et al. | |
| 2013/0279867 A1 | 10/2013 | Oyamada et al. | |
| 2014/0205236 A1 | 7/2014 | Noguchi et al. | |
| 2014/0308005 A1 | 10/2014 | Lee et al. | |
| 2015/0204723 A1 | 7/2015 | Zheng et al. | |
| 2015/0247163 A1 | 8/2015 | Chann et al. | |
| 2015/0331205 A1 | 11/2015 | Tayebati et al. | |
| 2015/0378184 A1 | 12/2015 | Tayebati et al. | |
| 2016/0116679 A1 | 4/2016 | Muendel et al. | |
| 2016/0310106 A1 | 10/2016 | Kim et al. | |
| 2017/0293084 A1 | 10/2017 | Zhou et al. | |
| 2018/0003883 A1 | 1/2018 | Zhu | |
| 2018/0159299 A1 | 6/2018 | Zhou et al. | |
| 2018/0210144 A1 | 7/2018 | Villarreal-Saucedo et al. | |
| 2018/0372959 A1 | 12/2018 | Zhou et al. | |
| 2019/0113688 A1 | 4/2019 | Zhou et al. | |
| 2019/0214783 A1 | 7/2019 | Zhou et al. | |
| 2019/0258009 A1 | 8/2019 | Huber et al. | |
| 2020/0018894 A1 | 1/2020 | Villarreal-Saucedo et al. | |
| 2020/0280165 A1 | 9/2020 | Zhou et al. | |

* cited by examiner

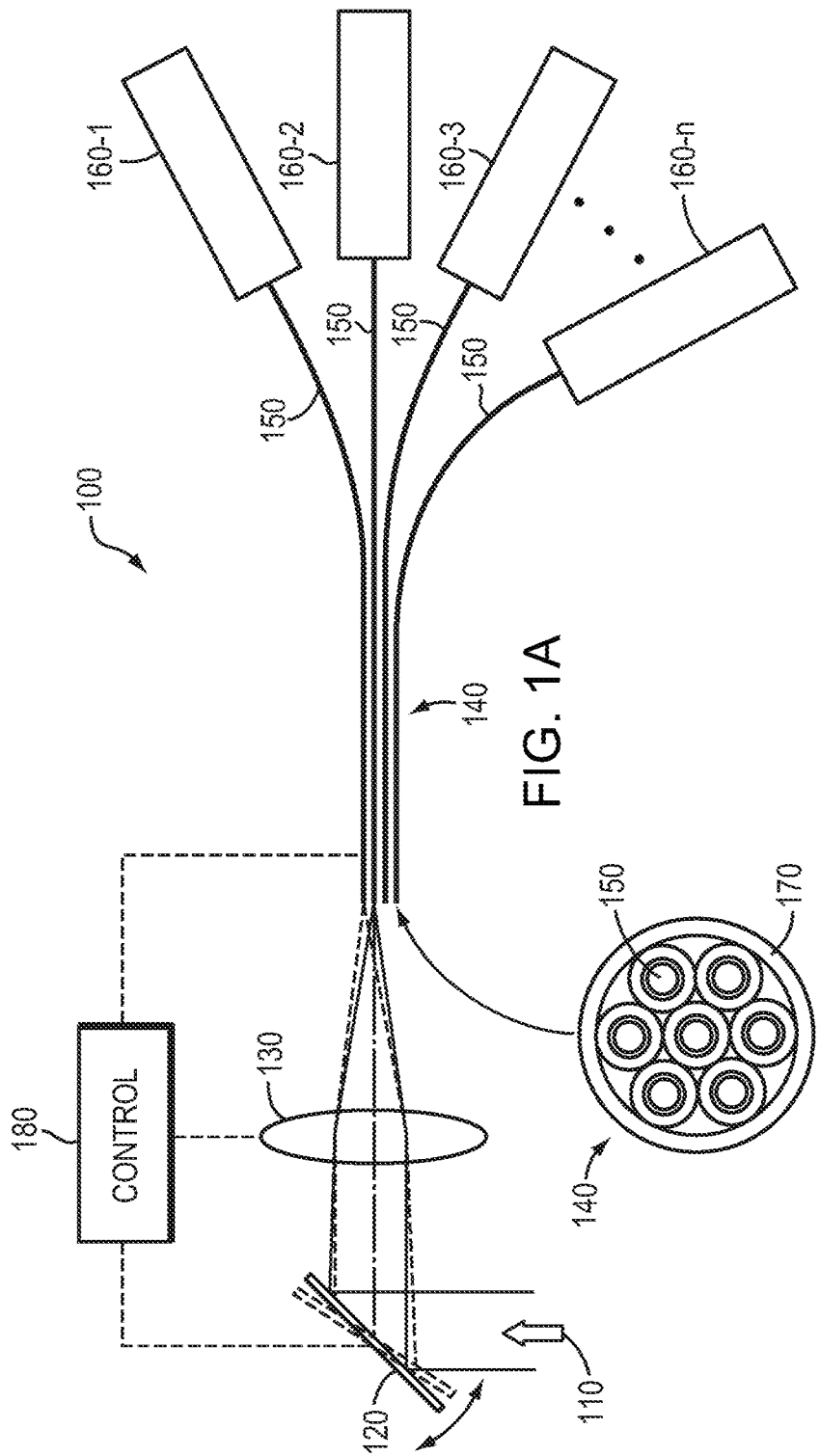

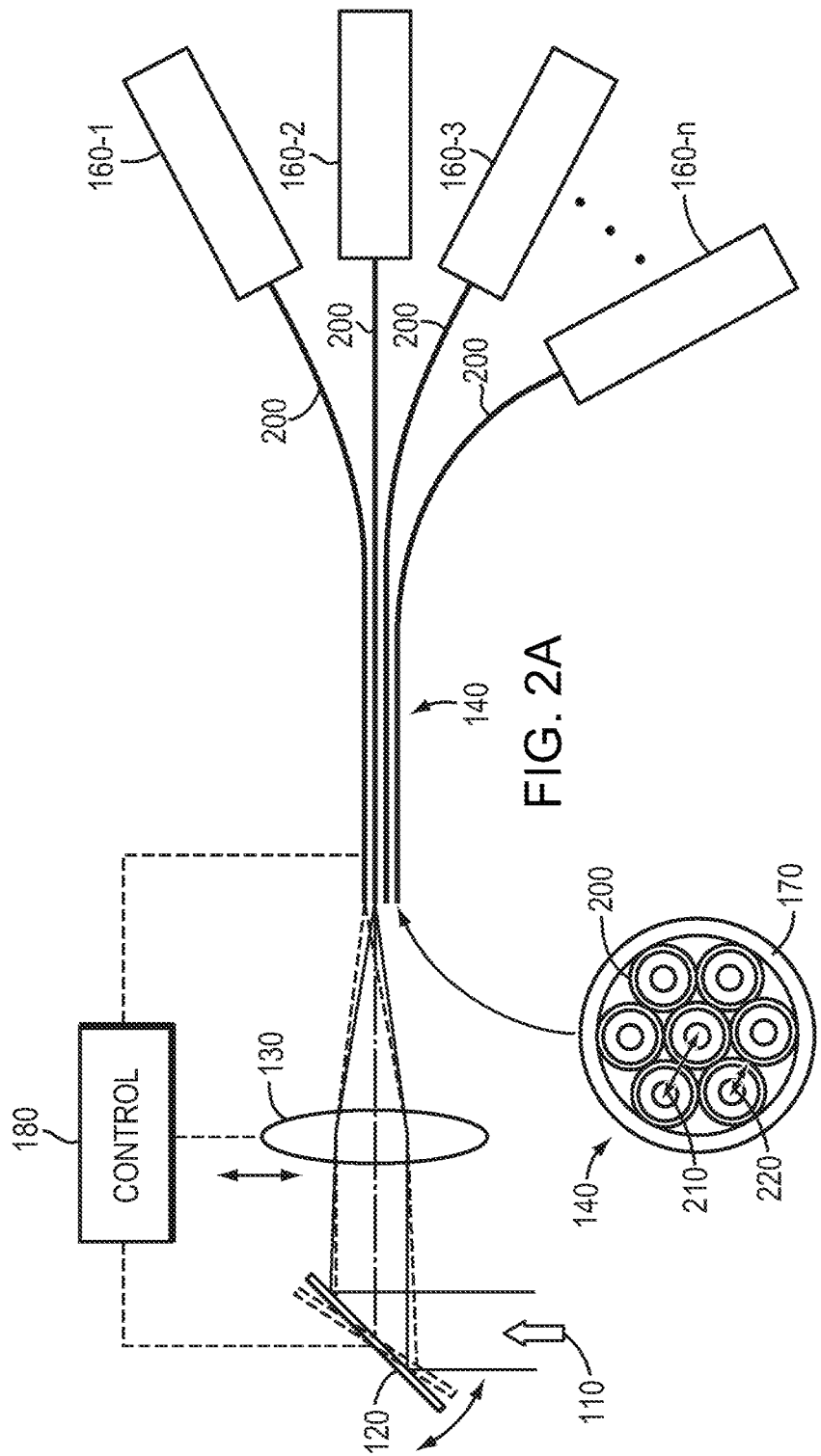

LASER SYSTEMS UTILIZING FIBER BUNDLES FOR POWER DELIVERY AND BEAM SWITCHING

RELATED APPLICATIONS

This application is a continuation of U.S. patent application Ser. No. 17/140,293, filed Jan. 4, 2021, which is a continuation of U.S. patent application Ser. No. 16/816,564, filed Mar. 12, 2020, which is a continuation of U.S. patent application Ser. No. 16/245,349, filed Jan. 11, 2019, which is a continuation of U.S. patent application Ser. No. 15/807,795, filed Nov. 9, 2017, which claims the benefit of and priority to U.S. Provisional Patent Application No. 62/429,270, filed Dec. 2, 2016, the entire disclosure of each of which is hereby incorporated herein by reference.

TECHNICAL FIELD

In various embodiments, the present invention relates to laser systems, specifically laser systems with multiple outputs and controllable beam profiles, e.g., variable beam parameter products.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

Optical systems for laser systems are typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). That is, BPP=NA×D/2, where D is the focusing spot (the waist) diameter and NA is the numerical aperture; thus, the BPP may be varied by varying NA and/or D. The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, which is a wavelength-independent measure of beam quality.

In many laser-processing applications, the desired beam spot size, divergence, and beam quality may vary depending on, for example, the type of processing and/or the type of material being processed. This is particularly true for industrial lasers in material processing applications. For example, a lower BPP value, i.e., a better beam quality, may be preferred for cutting a thin metal, while a larger BPP (i.e., a worse beam quality) may be preferred for cutting through thicker metals. In order to make such changes to the BPP of the laser system, frequently the output optical system or the optical fiber must be swapped out with other components and/or realigned, a time-consuming and expensive process that may even lead to inadvertent damage of the fragile optical components of the laser system. Thus, there is a need for alternative techniques for varying the BPP of a laser system that do not involve such adjustments to the laser beam or optical system at the output of the optical fiber. In addition, there is a need for laser systems having multiple output beams with variable BPP, thereby enabling the sharing of the laser system among different workstations.

SUMMARY

In accordance with embodiments of the present invention, laser systems produce output beams that are directed into one or more optical fibers of a fiber bundle for output to any of multiple discrete locations. One or more of the optical fibers of the fiber bundle may be multi-clad fibers, i.e., incorporate a central core region with multiple cladding regions concentrically surrounding the core region. In other embodiments, one or more of the optical fibers may be single-clad fibers, i.e., have only one cladding region surrounding the core region. In various embodiments, different optical fibers in the fiber bundle have different core diameters. One or more of the fibers in the fiber bundle may have multiple discrete core regions. In accordance with various embodiments, the laser output beam is directed into a particular fiber of the fiber bundle and/or into one or more specific cross-sectional regions of the fiber (e.g., the core region and/or one or more of the cladding regions) in order to vary the beam shape and/or the BPP of the output beam.

As utilized herein, changing the "shape" of a laser beam refers to altering the cross-sectional profile and dimension(s) of the beam (e.g., at a point at which the beam intersects a surface). Changes in shape may be accompanied by changes in beam size, angular intensity distribution of the beam, and BPP, but mere changes in beam BPP are not necessarily sufficient to change laser beam shape and vice versa.

Output beams produced in accordance with embodiments of the present invention may be utilized to process a workpiece such that the surface of the workpiece is physically altered and/or such that a feature is formed on or within the surface, in contrast with optical techniques that merely probe a surface with light (e.g., reflectivity measurements). Exemplary processes in accordance with embodiments of the invention include cutting, welding, drilling, and soldering. Various embodiments of the invention may also process workpieces at one or more spots or along a one-dimensional linear or curvilinear processing path, rather than flooding all or substantially all of the workpiece surface with radiation from the laser beam. Such one-dimensional paths may be composed of multiple segments, each of which may be linear or curvilinear.

One advantage of variable shape and/or BPP is improved laser application performance for different types of processing techniques or different types of materials being processed. Embodiments of the invention may also utilize various techniques for varying BPP and/or shape of laser beams described in U.S. patent application Ser. No. 14/632,283, filed on Feb. 26, 2015, U.S. patent application Ser. No. 14/747,073, filed Jun. 23, 2015, U.S. patent application Ser. No. 14/852,939, filed Sep. 14, 2015, U.S. patent application Ser. No. 15/188,076, filed Jun. 21, 2016, U.S. patent application Ser. No. 15/479,745, filed Apr. 5, 2017, and U.S. patent application Ser. No. 15/649,841, filed Jul. 14, 2017, the disclosure of each of which is incorporated in its entirety herein by reference.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs).

Embodiments of the invention may be utilized with wavelength beam combining (WBC) systems that include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein. Multi-wavelength output beams of WBC systems may be utilized as input beams in conjunction with embodiments of the present invention for, e.g., BPP, shape, and/or polarization control.

In an aspect, embodiments of the invention feature a laser system having multiple outputs. The system includes, consists essentially of, or consists of a beam emitter for emission of a laser beam, a fiber bundle, a reflector and/or an optical element, and a controller. The fiber bundle includes, consists essentially of, or consists of a plurality of optical fibers. Each of the optical fibers has (i) an input end for receiving a laser beam, and (ii) opposite the input end, an output end for delivery of the received laser beam to a workpiece. The reflector and/or the optical element may receive the laser beam and couple the laser beam into one or more (e.g., only one) of the input ends of the optical fibers in the fiber bundle. For example, the reflector may receive the laser beam and reflect the laser beam toward the fiber bundle, and the optical element may receive the laser beam from the reflector and couple the laser beam into one or more (e.g., only one) of the input ends of an optical fiber in the fiber bundle. The controller causes and controls relative motion between the input ends of the optical fibers and the reflector and/or the optical element to thereby determine (i) the optical fiber(s) of the fiber bundle into which the laser beam is coupled and/or (ii) a location at which the laser beam is directed on an end face of one or more selected fibers, whereby a beam shape and/or a beam parameter product is determined at least in part by the coupling of the laser beam into the optical fiber(s).

Embodiments of the invention may include one or more of the following in any of a variety of combinations. The controller may be configured for feedback operation to progressively adjust the location at which the laser beam is directed on the end face of the selected fiber based on a measured parameter. The measured parameter may be a measured parameter of the workpiece (e.g., composition, thickness, height or depth of a surface feature, reflectivity, etc.) and/or of the laser beam (e.g., flux density, beam shape, beam diameter, beam intensity, beam intensity as a function of areal beam location, etc.). The relative motion between the input ends of the optical fibers and the reflector and/or the optical element may include, consist essentially of, or consist of rotation of the reflector, rotation of the optical element, translation of the reflector, translation of the optical element, rotation of the input ends of the optical fibers, and/or translation of the input ends of the optical fibers. The optical element may include, consist essentially of, or consist of one or more lenses, one or more gratings (e.g., diffraction gratings), and/or one or more prisms. One or more physical characteristics of at least two of the optical fibers in the fiber bundle may be different. The physical characteristic may include, consist essentially of, or consist of a quantity of fiber cores, a quantity of cladding regions, a diameter of a fiber core, a thickness of a cladding region, a refractive index of a fiber core, and/or a refractive index of a cladding region. The system may include an input end cap. One or more of the input ends of the optical fiber in the fiber bundle may be fused to or otherwise optically coupled to the input end cap. An output end cap may be disposed on, fused to, and/or optically coupled to the output end of one or more of the optical fibers. Each optical fiber may have a different output end cap.

At least one of the optical fibers may include, consist essentially of, or consist of a multi-clad optical fiber having multiple claddings surrounding one or more fiber cores. For example, the multi-clad optical fiber may include, consist essentially of, or consist of a fiber core, a first cladding region surrounding the fiber core, and a second cladding region surrounding the first cladding region. The refractive index of the fiber core may be larger than a refractive index of the first cladding region. The refractive index of the first cladding region may be larger than a refractive index of the second cladding region. The controller may be configured to, for the optical fiber of the fiber bundle into which the laser beam is coupled, control relative motion between the input ends of the optical fibers and the reflector and/or the optical element to thereby determine one or more portions of the optical fiber into which the laser beam is coupled. The portions of the optical fiber may include, consist essentially of, or consist of the fiber core, the first cladding region, and the second cladding region. The portions of the optical fiber may include, consist essentially of, or consist of, more generally, one or more fiber cores and/or one or more cladding regions.

At least one of the optical fibers may include, consist essentially of, or consist of a step-clad optical fiber including, consisting essentially of, or consisting of (i) a central core having a first refractive index, (ii) surrounding the central core, a first cladding having a second refractive index, (iii) surrounding the first cladding, an annular core having a third refractive index, and (iv) surrounding the annular core, a second cladding having a fourth refractive index. The first refractive index may be larger than the fourth refractive index. The third refractive index may be larger than the fourth refractive index. The second refractive index may be smaller than the first refractive index and larger than the fourth refractive index. The controller may be configured to, for the optical fiber of the fiber bundle into which the laser beam is coupled, control relative motion between the input ends of the optical fibers and the reflector and/or the optical element to thereby determine one or more portions of the optical fiber into which the laser beam is coupled. The portions of the optical fiber may include, consist essentially of, or consist of the central core, the first cladding, and the annular core. The portions of the optical fiber may include, consist essentially of, or consist of the central core and the first cladding. The portions of the optical fiber may include, consist essentially of, or consist of the central core, the first cladding, the annular core, and the second cladding. The portions of the optical fiber may include, consist essentially of, or consist of the first cladding and the annular core. The portions of the optical fiber may include, consist essentially of, or consist of the first cladding, the annular core, and the second cladding.

The beam emitter may be responsive to the controller. The controller may be configured to modulate an output power of the beam emitter during relative motion between the input ends of the optical fibers and the reflector and/or the optical element. The controller may be configured to not modulate an output power of the beam emitter during relative motion between the input ends of the optical fibers and the reflector and/or the optical element. The controller may be configured to increase the beam parameter product of the laser beam by coupling at least a portion of the laser beam into one or more cladding regions of the optical fiber(s) into which the laser beam is coupled. The controller may be configured to determine the beam shape and/or the beam parameter product based at least in part on a characteristic of the workpiece proximate the output end of the optical fiber into which the laser beam is coupled. The characteristic of the workpiece may include, consist essentially of, or consist of a thickness of the workpiece and/or a composition of the workpiece. The system may include a memory, accessible to the controller, for storing data corresponding to a processing path defined on the workpiece. The path may include at least one directional change. The path may be composed of one or more linear segments and/or one or more curvilinear segments. The controller may be configured to alter the output power, beam shape, and/or beam parameter product of the beam along the processing path. The memory may be at least in part resident in the controller and/or at least in part resident remotely (e.g., network storage, cloud storage, etc.). The system may include a database for storing processing data for a plurality of materials. The controller may be configured to query the database to obtain processing data for one or more materials of the workpiece. The beam shape and/or the beam parameter product of the beam may be determined at least in part by the obtained processing data.

The beam emitter may include, consist essentially of, or consist of one or more beam sources emitting a plurality of discrete beams, focusing optics for focusing the plurality of beams onto a dispersive element, a dispersive element for receiving and dispersing the received focused beams, and a partially reflective output coupler positioned to receive the dispersed beams, transmit a portion of the dispersed beams therethrough as the laser beam, and reflect a second portion of the dispersed beams back toward the dispersive element. The laser beam may be composed of multiple wavelengths. Each of the discrete beams may have a different wavelength. The second portion of the dispersed beams may propagate back to the one or more beam sources to thereby stabilize the beams to their emission wavelengths. The focusing optics may include or consist essentially of one or more cylindrical lenses, one or more spherical lenses, one or more spherical mirrors, and/or one or more cylindrical mirrors. The dispersive element may include, consist essentially of, or consist of one or more diffraction gratings (e.g., one or more transmissive gratings and/or one or more reflective gratings), one or more dispersive fibers, and/or one or more prisms.

In another aspect, embodiments of the invention feature a method of adjusting a beam parameter product and/or a beam shape of a laser beam. A fiber bundle is provided. The fiber bundle includes, consists essentially of, or consists of a plurality of optical fibers. Each of the optical fibers has (i) an input end for receiving a laser beam, and (ii) opposite the input end, an output end for delivery of the received laser beam. A laser beam is directed toward a selected one or more of the optical fibers of the fiber bundle. There during and/or thereafter, the beam parameter product and/or the beam shape of the laser beam is selected by directing the laser beam onto one or more first in-coupling locations on the input end(s) of the selected optical fiber(s).

Embodiments of the invention may include one or more of the following in any of a variety of combinations. One or more workpieces disposed proximate the output end(s) of the selected optical fiber(s) may be processed with the laser beam. The beam parameter product and/or the beam shape of the laser beam may be selected based at least in part of a characteristic of one or more of the workpieces. The characteristic of the workpiece may include, consist essentially of, or consist of a thickness of the workpiece and/or a composition of the workpiece. At least one of the first in-coupling locations may intersect a cladding region of a selected optical fiber. Directing the laser beam toward the selected one of the optical fibers may include, consist essentially of, or consist of (i) reflecting the laser beam with one or more reflectors and/or (ii) focusing the laser beam with one or more optical elements. One or more physical characteristics of at least two of the optical fibers in the fiber bundle may be different. The physical characteristic may include, consist essentially of, or consist of a quantity of fiber cores, a quantity of cladding regions, a diameter of a fiber core, a thickness of a cladding region, a refractive index of a fiber core, and/or a refractive index of a cladding region.

At least one of the optical fibers may include, consist essentially of, or consist of a multi-clad optical fiber having multiple claddings surrounding one or more fiber cores. For example, the multi-clad optical fiber may include, consist essentially of, or consist of a fiber core, a first cladding region surrounding the fiber core, and a second cladding region surrounding the first cladding region. The refractive index of the fiber core may be larger than a refractive index of the first cladding region. The refractive index of the first cladding region may be larger than a refractive index of the second cladding region.

At least one of the optical fibers may include, consist essentially of, or consist of a step-clad optical fiber including, consisting essentially of, or consisting of (i) a central core having a first refractive index, (ii) surrounding the central core, a first cladding having a second refractive index, (iii) surrounding the first cladding, an annular core having a third refractive index, and (iv) surrounding the annular core, a second cladding having a fourth refractive index. The first refractive index may be larger than the fourth refractive index. The third refractive index may be larger than the fourth refractive index. The second refractive index may be smaller than the first refractive index and larger than the fourth refractive index.

The beam parameter product and/or the beam shape of the laser beam may be altered by directing the laser beam onto one or more second in-coupling locations on the input end of the selected optical fiber and/or one or more other optical fibers in the fiber bundle. The one or more second in-coupling locations may be different from the one or more first in-coupling locations. The laser beam may be emitted from a beam emitter including, consisting essentially of, or consisting of one or more beam sources emitting a plurality of discrete beams, focusing optics for focusing the plurality of beams onto a dispersive element, a dispersive element for receiving and dispersing the received focused beams, and a partially reflective output coupler positioned to receive the dispersed beams, transmit a portion of the dispersed beams therethrough as the laser beam, and reflect a second portion of the dispersed beams back toward the dispersive element. The laser beam may be composed of multiple wavelengths. Each of the discrete beams may have a different wavelength. The second portion of the dispersed beams may propagate back to the one or more beam sources to thereby stabilize the beams to their emission wavelengths. The focusing optics may include or consist essentially of one or more cylindrical lenses, one or more spherical lenses, one or more spherical mirrors, and/or one or more cylindrical mirrors. The dispersive element may include, consist essentially of, or consist of one or more diffraction gratings (e.g., one or more transmissive gratings and/or one or more reflective gratings), one or more dispersive fibers, and/or one or more prisms.

In yet another aspect, embodiments of the invention feature a method of processing a plurality of workpieces using output beams having different characteristics and originating from the same input beam. A fiber bundle is provided. The fiber bundle includes, consists essentially of, or consists of a first optical fiber and a second optical fiber. The first optical fiber has (a) a first input end for receiving a laser beam and (b) opposite the first input end, a first output end for delivery of the laser beam to a first workpiece. The second optical fiber has (a) for receiving the laser beam, a second input end proximate the first input end, and (b) opposite the second input end, a second output end for delivery of the laser beam to a second workpiece different from the first workpiece. In various embodiments, the first and second output ends deliver the laser beam to different portions of the same workpiece. The laser beam is directed toward the first input end to process the first workpiece. Before and/or during the processing of the first workpiece, a first beam parameter product and/or a first beam shape of the laser beam is selected by directing the laser beam onto one or more first in-coupling locations on the first input end. The laser beam is directed toward the second input end to process the second workpiece. Before and/or during the processing of the second workpiece, a second beam parameter product and/or a second beam shape of the laser beam is selected by directing the laser beam onto one or more second in-coupling locations on the second input end. The second beam parameter product and/or the second beam shape may be different from the first beam parameter product and/or the first beam shape. The second beam parameter product and/or the second beam shape may be the same as the first beam parameter product and/or the first beam shape.

Embodiments of the invention may include one or more of the following in any of a variety of combinations. At least one characteristic of the first and second workpieces may be different. The at least one characteristic may include, consist essentially of, or consist of thickness and/or composition. The output power of the laser beam may be modulated between directing the laser beam toward the first input end and directing the laser beam toward the second input end. The output power of the laser beam may not be modulated between directing the laser beam toward the first input end and directing the laser beam toward the second input end. An interior configuration of the first optical fiber may be substantially identical to an interior configuration of the second optical fiber. At least one of the first in-coupling locations may intersect one or more cladding regions of the first optical fiber, and beam energy coupled into the one or more cladding regions may be utilized to process the first workpiece. At least one of the second in-coupling locations may intersect one or more cladding regions of the second optical fiber, and beam energy coupled into the one or more cladding regions may be utilized to process the second workpiece. Directing the laser beam toward the first input end may include, consist essentially of, or consist of (i) reflecting the laser beam with one or more reflectors and/or (ii) focusing the laser beam with one or more optical elements. Directing the laser beam toward the second input end may include, consist essentially of, or consist of (i) reflecting the laser beam with one or more reflectors and/or (ii) focusing the laser beam with one or more optical elements. A physical characteristic of the first optical fiber and the second optical fiber may be different. The physical characteristic may include, consist essentially of, or consist of a quantity of fiber cores, a quantity of cladding regions, a diameter of a fiber core, a thickness of a cladding region, a refractive index of a fiber core, and/or a refractive index of a cladding region.

The first optical fiber and/or the second optical fiber may include, consist essentially of, or consist of a multi-clad optical fiber having multiple claddings surrounding one or more fiber cores. For example, the multi-clad optical fiber may include, consist essentially of, or consist of a fiber core, a first cladding region surrounding the fiber core, and a second cladding region surrounding the first cladding region. The refractive index of the fiber core may be larger than a refractive index of the first cladding region. The refractive index of the first cladding region may be larger than a refractive index of the second cladding region.

The first optical fiber and/or the second optical fiber may include, consist essentially of, or consist of a step-clad optical fiber including, consisting essentially of, or consisting of (i) a central core having a first refractive index, (ii) surrounding the central core, a first cladding having a second refractive index, (iii) surrounding the first cladding, an annular core having a third refractive index, and (iv) surrounding the annular core, a second cladding having a fourth refractive index. The first refractive index may be larger than the fourth refractive index. The third refractive index may be larger than the fourth refractive index. The second refractive index may be smaller than the first refractive index and larger than the fourth refractive index.

The laser beam may be emitted from a beam emitter including, consisting essentially of, or consisting of one or more beam sources emitting a plurality of discrete beams, focusing optics for focusing the plurality of beams onto a dispersive element, a dispersive element for receiving and dispersing the received focused beams, and a partially reflective output coupler positioned to receive the dispersed beams, transmit a portion of the dispersed beams therethrough as the laser beam, and reflect a second portion of the dispersed beams back toward the dispersive element. The laser beam may be composed of multiple wavelengths. Each of the discrete beams may have a different wavelength. The second portion of the dispersed beams may propagate back to the one or more beam sources to thereby stabilize the beams to their emission wavelengths. The focusing optics may include or consist essentially of one or more cylindrical lenses, one or more spherical lenses, one or more spherical mirrors, and/or one or more cylindrical mirrors. The dispersive element may include, consist essentially of, or consist of one or more diffraction gratings (e.g., one or more transmissive gratings and/or one or more reflective gratings), one or more dispersive fibers, and/or one or more prisms.

In another aspect, embodiments of the invention feature a method of processing a workpiece with a laser beam. A fiber bundle is provided. The fiber bundle includes, consists essentially of, or consists of a plurality of optical fibers. Each of the optical fibers has (i) an input end for receiving a laser beam, and (ii) opposite the input end, an output end for delivery of the received laser beam. A workpiece is disposed proximate the output end of a selected one of the optical fibers. A beam parameter product and/or a beam shape for processing of the workpiece is determined based on at least one characteristic of the workpiece. A laser beam is directed toward the selected optical fiber. While the laser beam is being directed toward the selected optical fiber, the laser beam is directed onto one or more in-coupling locations on the input end of the selected optical fiber to select the beam parameter product and/or the beam shape of the laser beam emitted from the output end of the selected optical fiber. The workpiece is processed with the laser beam emitted from the output end of the selected optical fiber.

Embodiments of the invention may include one or more of the following in any of a variety of combinations. Processing the workpiece may include, consist essentially of, or consist of physically altering at least a portion of and/or forming a feature on and/or in a surface of the workpiece. Processing the workpiece may include, consist essentially of, or consist of cutting, welding, etching, annealing, drilling, soldering, and/or brazing. The at least one characteristic of the workpiece may include, consist essentially of, or consist of a thickness of the workpiece and/or a composition of the workpiece. At least one of the in-coupling locations may intersect one or more cladding regions of the selected optical fiber, and beam energy coupled into the one or more cladding regions may be utilized to process the workpiece. Directing the laser beam toward the selected optical fiber may include, consist essentially of, or consist of (i) reflecting the laser beam with one or more reflectors and/or (ii) focusing the laser beam with one or more optical elements. A physical characteristic of at least two of the optical fibers in the fiber bundle may be different. The physical characteristic may include, consist essentially of, or consist of a quantity of fiber cores, a quantity of cladding regions, a diameter of a fiber core, a thickness of a cladding region, a refractive index of a fiber core, and/or a refractive index of a cladding region.

The selected optical fiber may include, consist essentially of, or consist of a multi-clad optical fiber having multiple claddings surrounding one or more fiber cores. For example, the multi-clad optical fiber may include, consist essentially of, or consist of a fiber core, a first cladding region surrounding the fiber core, and a second cladding region surrounding the first cladding region. The refractive index of the fiber core may be larger than a refractive index of the first cladding region. The refractive index of the first cladding region may be larger than a refractive index of the second cladding region.

The selected optical fiber may include, consist essentially of, or consist of a step-clad optical fiber including, consisting essentially of, or consisting of (i) a central core having a first refractive index, (ii) surrounding the central core, a first cladding having a second refractive index, (iii) surrounding the first cladding, an annular core having a third refractive index, and (iv) surrounding the annular core, a second cladding having a fourth refractive index. The first refractive index may be larger than the fourth refractive index. The third refractive index may be larger than the fourth refractive index. The second refractive index may be smaller than the first refractive index and larger than the fourth refractive index.

The beam parameter product and/or the beam shape of the laser beam may be altered while or after processing the workpiece by directing the laser beam onto one or more second in-coupling locations on the input end of the selected optical fiber and/or one or more other optical fibers in the fiber bundle. The one or more second in-coupling locations may be different from the one or more first in-coupling locations. The laser beam may be emitted from a beam emitter including, consisting essentially of, or consisting of one or more beam sources emitting a plurality of discrete beams, focusing optics for focusing the plurality of beams onto a dispersive element, a dispersive element for receiving and dispersing the received focused beams, and a partially reflective output coupler positioned to receive the dispersed beams, transmit a portion of the dispersed beams therethrough as the laser beam, and reflect a second portion of the dispersed beams back toward the dispersive element. The laser beam may be composed of multiple wavelengths. Each of the discrete beams may have a different wavelength. The second portion of the dispersed beams may propagate back to the one or more beam sources to thereby stabilize the beams to their emission wavelengths. The focusing optics may include or consist essentially of one or more cylindrical lenses, one or more spherical lenses, one or more spherical mirrors, and/or one or more cylindrical mirrors. The dispersive element may include, consist essentially of, or consist of one or more diffraction gratings (e.g., one or more transmissive gratings and/or one or more reflective gratings), one or more dispersive fibers, and/or one or more prisms.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 1A is a schematic diagram of a laser system incorporating a fiber bundle of multiple optical fibers in accordance with various embodiments of the invention;

FIG. 1B is a schematic cross-sectional diagram of the fiber bundle of FIG. 1A;

FIG. 2A is a schematic diagram of a laser system incorporating a fiber bundle of multiple optical fibers in accordance with various embodiments of the invention;

FIG. 2B is a schematic cross-sectional diagram of the fiber bundle of FIG. 2A;

DETAILED DESCRIPTION

Figures 1C, 1D:
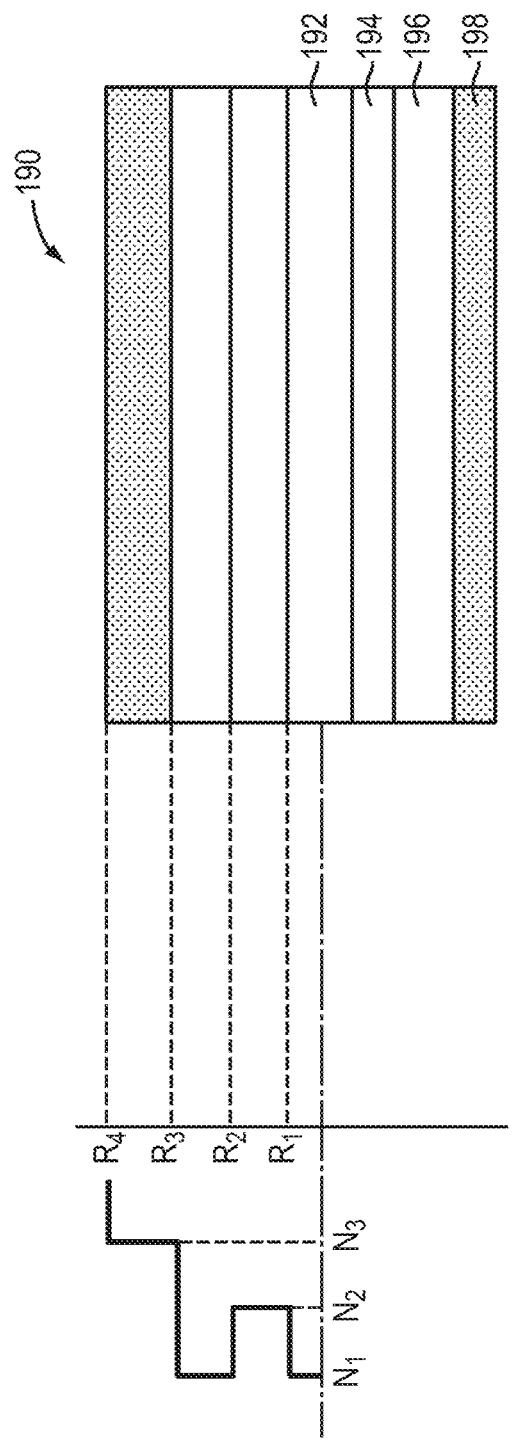
FIG. 1C is a schematic cross-sectional diagram of a step-clad optical fiber in accordance with various embodiments of the invention.
FIG. 1D is a schematic graph of the relative refractive indices of portions of the step-clad optical fiber of FIG. 1C.

FIG. 1A depicts a laser system 100 in accordance with various embodiments of the present invention. As shown, a laser beam 110 (which may be, e.g., the output beam of a WBC system) is directed by a reflector 120 (e.g., one or more mirrors) and coupled by an optical element 130 (e.g., one or more lenses) into one of multiple fibers of a fiber bundle 140, which includes, consists essentially of, or consists of two or more optical fibers 150, at least two (or even all) of which may have different internal configurations (e.g., numbers of cladding layers, number of cores, refractive indices of cores and/or claddings, sizes of cores and/or claddings, etc.). Each of the optical fibers 150 of the fiber bundle 140 is connected to a different laser head 160 (the four laser heads 160 in FIG. 1A are labeled as laser heads 160-1, 160-2, 160-3, and 160-$n$; embodiments of the invention may include as few as two laser heads 160 or more than four laser heads 160) that may include, for example, further optics for directing the output laser beam toward a workpiece for materials processing such as cutting, welding, etc. FIG. 1A depicts an exemplary embodiment in which the laser beam 110 is being coupled to either laser head 160-1 or laser head 160-2 via movement (e.g., rotation and/or translation) of the reflector 120. The laser beam 110 may be directed toward one or more of the fibers 150 of fiber bundle 140 by other means in addition to or instead of reflector 120; for example, movement of the optical element 130, the use of one or more adjustable optical elements such as prisms, etc. In various embodiments of the invention, the fibers 150 of the fiber bundle 140 may be multi-mode fibers, and the core diameters of such fibers may be, e.g., at least 20 µm. FIG. 1B depicts a schematic end-on view of the fiber bundle 140. Although FIG. 1B depicts the fibers of the fiber bundle arranged in a close-packed, round configuration, embodiments of the invention also include other arrangements of the fibers within the fiber bundle, e.g., linear.

During operation of the laser system 100, the power of the laser beam 110 may be decreased or the laser beam 110 may be turned off or directed to a component other than fiber bundle 140 (e.g., a beam dump to discard or dissipate the beam energy) during at least a portion of the time period during which the laser beam 110 is directed from one of the fibers 150 to another. In various embodiments of the invention, in order to reduce the risk of damage to the fibers 150, the input side of the fiber bundle 140 is attached (e.g., via fusion) to a glass endcap. That is, the input side of the fiber bundle may be a unitary segment within which the different fibers 150 are coupled to different areal portions of the glass endcap. As shown in FIG. 1B, the fibers, at least at the input end of fiber bundle 140, may be disposed within a sheath 170. The output side of each fiber 150 may also be fused to an individual glass endcap. The glass endcaps (not shown in FIG. 1A) may have lengths of, e.g., at least 5 mm. The lengths of the endcaps may be, e.g., 50 mm or less.

In accordance with various embodiments of the invention, the various core and cladding layers of optical fibers in fiber bundles may include, consist essentially of, or consist of glass, such as substantially pure fused silica and/or fused silica doped with fluorine, titanium, germanium, and/or boron. Selection of proper materials to achieve the desired refractive indices in different portions of the optical fibers (e.g., core and cladding regions) may be performed by those of skill in the art without undue experimentation.

In various embodiments, the laser system 100 may output multiple beams substantially simultaneously via rapid steering of the laser beam 110 among two or more fibers 150; in such embodiments, multiple laser heads 160 may be utilized for materials processing simultaneously. Embodiments of the invention provide a convenient way to deliver laser beams having different BPPs and/or beam shapes to different workstations and/or workpieces. For example, the fiber bundle 140 may include fibers 150 having different core diameters. In an example embodiment, the fiber bundle 140 incorporates optical fibers having different core diameters ranging from 100 µm to 600 µm, and thereby produces laser beams having BPP values ranging from ~4 to ~24 mm·mrad. These values are merely exemplary, and embodiments of the invention may be utilized to produce output laser beams having a wide range of BPPs and/or beam shapes, depending upon the configuration(s) of the fibers 150 within fiber bundle 140.

In various embodiments of the invention, the laser system 100 incorporates a controller 180 that controls the movement of the laser beam 110 among the various fibers 150 of the fiber bundle 140. For example, the controller 180 may control the movement (e.g., rotation and/or translation with respect to one, two or three degrees of freedom) of reflector 120, the optical element 130, and/or the fiber bundle 140 in order to cause the laser beam 110 to be directed into a different fiber 150 or a different portion of a fiber 150 in fiber bundle 140. For example, the reflector 120 and/or the optical element 130 may be moved via one or more piezoelectric actuators controlled by the controller 180. These actuators may incorporate stepper motors that incrementally rotate and/or translate a controlled element so as to bring the beam into a desired position. The controller 180 may also move the input ends of the fibers 150 of fiber bundle 140, in addition to or instead of controlling reflector 120 and/or optical element 130, in order to couple the laser beam 110 into different fibers 150 and/or different portions of a single fiber 150. The controller 180 may compute a proper position of a laser beam relative to a fiber end face based on a desired value of a beam property (e.g., flux density, beam diameter, beam shape, etc.) at the workpiece and a known relationship between the beam property and the position of the beam relative to a fiber end face or the most appropriate fiber in the bundle to carry the beam; or based on user input (e.g., a commanded degree of overlap with or position on a designated fiber's end face or a portion thereof (e.g., one or more cores or claddings)); or, as explained in greater detail below, may use feedback so that the optimal alignment between the beam and the end face of a designated fiber is progressively attained. For example, a photodetector or other light sensor may be utilized proximate the workpiece to monitor the beam shape, beam diameter, and/or flux density at the workpiece surface (for example, the beam property of the beam itself, or via measurement of a reflection from the workpiece surface), and the controller may utilize the measured value(s) as feedback to adjust the positioning of the input beam relative to the selected fiber end until the desired beam property is achieved at the workpiece. Other sensors may be utilized in addition or instead of light sensors in embodiments of the invention, e.g., thermal sensors and/or sensors measuring the effect of the beam on the workpiece surface (e.g., depth or profile sensors, etc.).

The controller 180 may also control the laser beam 110 before, during, or after the movement of the laser beam 110 relative to the fiber bundle 140; for example, the controller 180 may modulate the output power of the laser beam 110 and/or switch the laser beam 110 on or off during one or more (or even all) of the motion of the laser beam 110 relative to the fiber bundle 140.

The controller 180 may be provided as either software, hardware, or some combination thereof. For example, the controller 180 may be implemented on one or more conventional server-class computers, such as a PC having a CPU board containing one or more processors such as the Pentium or Celeron family of processors manufactured by Intel Corporation of Santa Clara, Calif., the 680x0 and POWER PC family of processors manufactured by Motorola Corporation of Schaumburg, Ill., and/or the ATHLON line of processors manufactured by Advanced Micro Devices, Inc., of Sunnyvale, Calif Thus, in various embodiments the controller 180 may include a processor (e.g., a central processing unit). The processor may also include a main memory unit for storing programs and/or data relating to the methods described above.

The memory may include random access memory (RAM), read only memory (ROM), and/or FLASH memory residing on commonly available hardware such as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the programs may be provided using external RAM and/or ROM such as optical disks, magnetic disks, as well as other commonly used storage devices. For embodiments in which the functions are provided as one or more software programs, the programs may be written in any of a number of high level languages such as PYTHON, FORTRAN, PASCAL, JAVA, C, C++, C #, BASIC, various scripting languages, and/or HTML. Additionally, the software may be implemented in an assembly language directed to the microprocessor resident on a target computer; for example, the software may be implemented in Intel 80x86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM. Control software implementing beam alignment with a desired spatial position and feedback-responsive movement is well-characterized in the scanner and plotter art.

Embodiments of the present invention may also utilize multi-clad optical fibers in the fiber bundle to provide control over the shape and/or BPP of the laser beam coupled into the fibers. For example, laser systems in accordance with embodiments of the invention may utilize step-clad optical fibers as detailed in U.S. patent application Ser. No. 15/479,745, filed on Apr. 5, 2017 ("the '745 application"), the entire disclosure of which is incorporated by reference herein. FIG. 1C is a cross-sectional schematic diagram of an example step-clad optical fiber 190 that may be utilized in fiber bundles in accordance with embodiments of the present invention. In accordance with various embodiments, step-clad fiber 190 includes, consists essentially of, or consists of a center core 192, a first cladding 194, an annular core 196, and a second cladding 198. As set forth in the '745 application, various properties of the first cladding 194 enable BPP variation based at least in part on the power coupled into the first cladding 194. Other BPP and/or beam shape variations may be achieved based on power coupled into other portions of step-clad optical fiber 190, either in addition to or instead of first cladding 194. FIG. 1D depicts the refractive index and radius of each layer of the step-clad fiber 190. As shown, the refractive index ($N_2$) of the first cladding 194 of the fiber 190 has a value between a high index $N_1$ and a low index $N_3$, so that the center core 192 will have a smaller NA, given by sqrt($N_1^2$-$N_2^2$), than the NA of the annular core 196, given by sqrt($N_1^2$-$N_3^2$). While FIG. 1D depicts the indices of refraction of the center core 192 and the annular core 196 as being approximately equal to each other, in various embodiments the index of refraction of the annular core 196 may be different from (i.e., either less than or greater than) the index of refraction of the center core 192; however, in general, the index of refraction of the annular core 196 remains larger than the index of refraction of the first cladding 194. In various embodiments, as disclosed in the '745 application, the annular core 196 may have the same refractive index as the first cladding 194, i.e., the annular core 196 depicted in FIGS. 1C and 1D merges into the first cladding 194. Step-clad fibers 190 in accordance with embodiments of the invention may have substantially all or all of the laser power coupled into the first cladding 194. More power coupled into the first cladding 194 will generally lead to larger BPP. In various embodiments, the diameter ratio of the first cladding 194 and the center core 192 is larger than 1.2, e.g., between 1.2 and 3, or even between 1.3 and 2.

FIG. 2A depicts a laser system 100 in which laser beam 110 is directed to a fiber bundle 140 that includes multiple multi-clad optical fibers 200. As shown and as detailed above, coupling of the laser beam 110 into the various optical fibers may be performed via movement of reflector 120 and/or optical element 130 under direction of the controller 180.

In various embodiments of the invention, the laser beam 110 may be switched among different fibers in fiber bundle 140 having different structures, e.g., different core diameters, different cladding diameters, different numbers of claddings, etc. Such switching may involve the movement of the laser beam 110 along a distance 210 from one fiber to another, as shown in FIG. 2B. In various embodiments, the properties (e.g., BPP) of the laser beam 110 may also be controlled via coupling of the laser beam 110 into different portions of a single optical fiber within the fiber bundle 140; such movements may, for example, couple beam power from the laser beam 110 into one or more different portions (e.g., cores and/or claddings) of the optical fiber. For example, FIG. 2B depicts the movement along a distance 220 of the laser beam 110 between the core region and a cladding region of a single optical fiber, a shorter distance than distance 210.

Two or more of the optical fibers within the fiber bundle 140 may have substantially identical interior configurations, i.e., have the same internal structures in terms of numbers, locations, and refractive indices of cores and claddings. The lengths of optical fibers having substantially identical interior configurations may be different in order to accommodate different distances between the input ends of the optical fibers and the output ends of the optical fibers. That is, the distances between the input end of the fiber bundle and the laser heads coupled to different otherwise internally identical optical fibers may be different.

Figure 3:
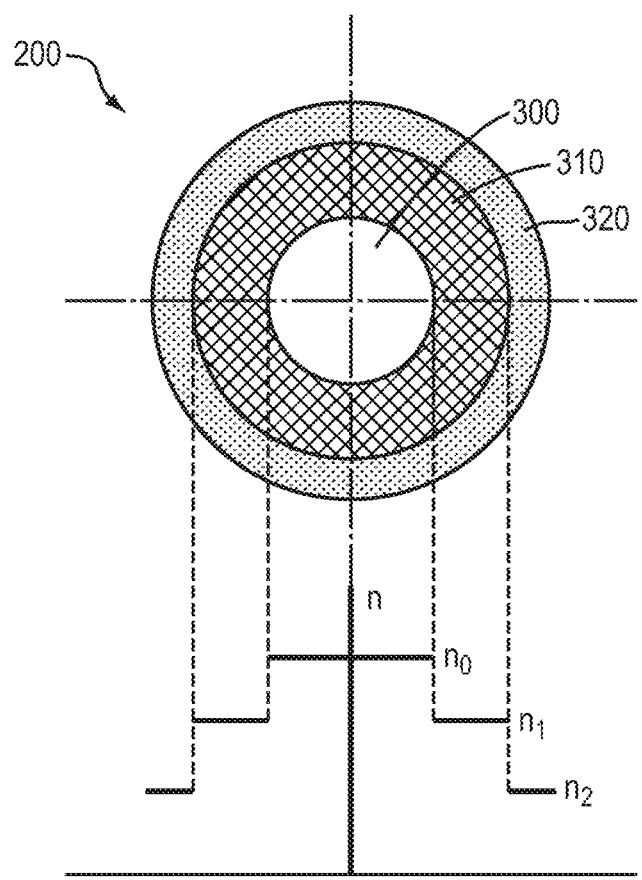
FIG. 3 is a schematic cross-sectional diagram of a multi-clad optical fiber, and a graph of the relative refractive indices of portions of the multi-clad optical fiber, in accordance with various embodiments of the invention.

FIG. 3 schematically depicts the structure and refractive index profile of an exemplary multi-clad fiber 200 that may be utilized in laser systems in accordance with embodiments of the invention. As shown, the multi-clad fiber 200 may have a core region 300 concentrically surrounded by a first cladding layer 310 and a second cladding layer 320. The fiber 200 may also have additional glass and/or polymer layers (not shown) for, e.g., mechanical support disposed outside of the second cladding layer 320. The index of refraction of the various regions of the multi-clad fiber 200 may decrease stepwise from the core 300 to the first cladding layer 310 to the second cladding layer 320, as shown in FIG. 3. In various embodiments, the core region 300 may have a diameter between 50 µm and 200 µm, e.g., approximately 100 µm. The thickness (or, in various embodiments, diameter) of the first cladding region 310 may range between, for example, 200 µm and 600 µm, e.g., approximately 400 µm to approximately 480 µm.

Figure 4:
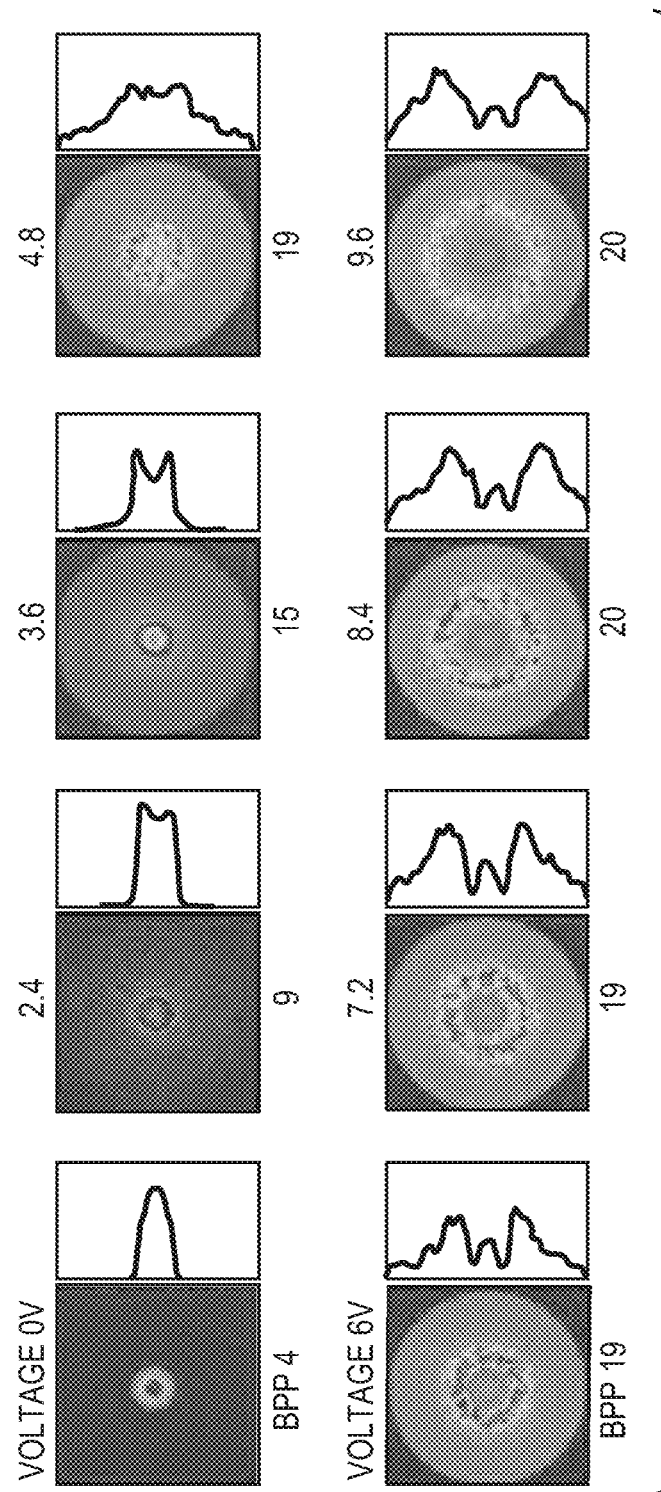
FIG. 4 is an exemplary sequence of beam shapes and BPPs as a function of applied beam-positioning voltage in accordance with various embodiments of the invention.
Figure 5:
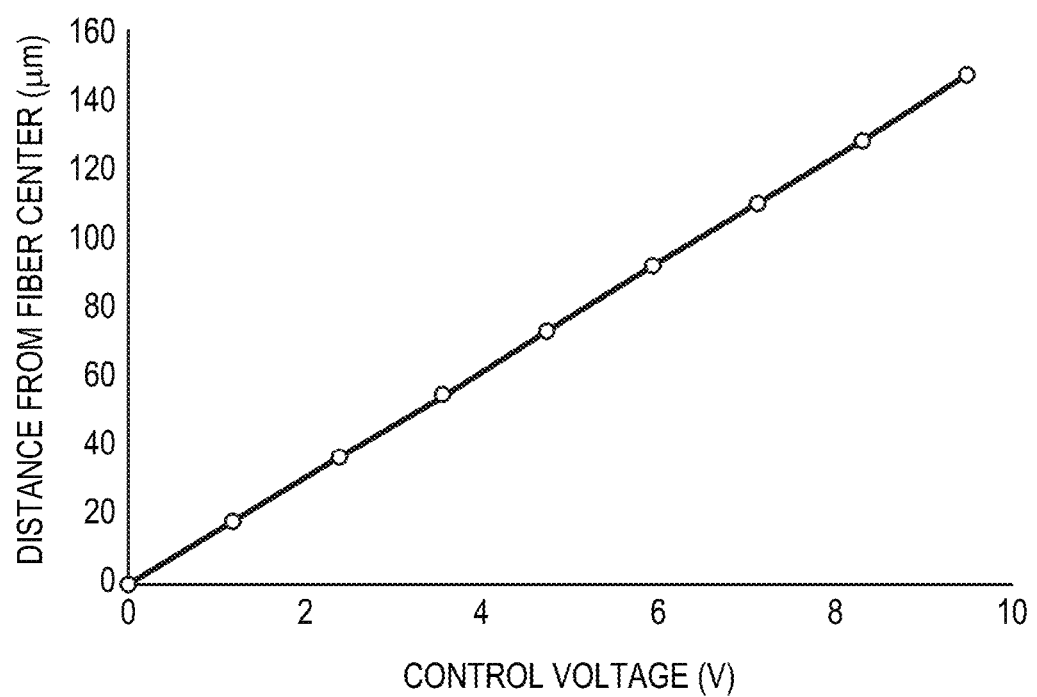
FIG. 5 is a graph of beam in-coupling position as a function of control voltage in accordance with various embodiments of the invention.

In various embodiments, movement of the laser beam 110 such that it is coupled into (a) the core region 300, (b) the first cladding region 310, or (c) both alters the BPP of the output beam. For example, FIG. 4 depicts various BPPs and beam shapes at the output end of a multi-clad optical fiber having a 100 µm core diameter and a first cladding layer of 480 µm diameter (i.e., the first cladding layer surrounds the core, and the outer boundary of the first cladding layer is 480 µm from the center of the fiber) for a 4 kW WBC laser beam coupled into the fiber via rotation of a reflector 120 controlled by a piezoelectric actuator via a voltage signal ranging from 0 to 10 V. As shown, the BPP of the laser beam ranges between 4 and 20, and the shape of the beam may be controlled to have one, two, or more distinct peaks. FIG. 5 is a graph illustrating the relationship between the voltage signal applied to a piezoelectric actuator configured for translational movement of the beam relative to the fiber end face and the approximate location on the cross-section of the multi-clad optical fiber at which the laser beam 110 is coupled. As shown in FIGS. 4 and 5, as the laser beam 110 is coupled increasingly off-center into the core and/or at least partially into the first cladding layer, the BPP of the resulting output beam tends to increase. In the situation depicted in FIGS. 4 and 5, the input beam has a diameter of about 95 µm; thus, the laser beam 110 begins to overlap the first cladding layer at voltages greater than about 0.5 V. In addition, the beam shape transitions from a single peak to a split narrow peak to a relatively flat broader peak to a double-peak shape. The input beam position may be varied while the input beam is operated at a substantially constant power, and thus the beam BPP and/or shape may transition smoothly from one value to another. In other embodiments, the power of the input beam may be decreased or turned off entirely as the beam position is moved (and then increased back to a desired level, which may or may not be substantially equal to the beam power prior to movement, after the beam is moved), and thus the beam BPP and/or shape may be altered discontinuously from one value to another.

Embodiments of the invention utilize such input beam movements within a single fiber to adjust output beam BPP and/or shape. Embodiments of the invention also utilize input beam movements among different optical fibers within a fiber bundle to provide such output beams with adjustable BPP and/or shape to different laser heads, as shown in FIGS. 1A and 2A. The different laser heads may be utilized to process different workpieces and may be physically located in different locations (e.g., different rooms or workstations in a processing facility). The controller 180 may, in accordance with the embodiments of the invention, control the BPP and/or beam shape of the output beam based on the type of desired processing (e.g., cutting, welding, etc.) and/or on one or more characteristics (e.g., materials parameters, thickness, material type, etc.) of the workpiece to be processed and/or of a desired processing path mapped out for the output beam. Such process and/or material parameters may be selected by a user from a stored database in a memory associated with controller 180 or may be entered via an input device (e.g., touchscreen, keyboard, pointing device such as a computer mouse, etc.). One or more processing paths may be provided by a user and stored in an onboard or remote memory associated with controller 180. After workpiece and/or processing path selection, the controller 180 queries the database to obtain the corresponding parameter values. The stored values may include a BPP and/or beam shape suitable to the material and/or to one or more processing paths or processing locations on the material.

As is well understood in the plotting and scanning art, the requisite relative motion between the beam and the desired beam path may be produced, as discussed above, by optical deflection of the beam using a movable mirror, physical movement of the laser using a gantry, lead-screw or other arrangement, and/or a mechanical arrangement for moving the workpiece rather than (or in addition to) the beam. The controller 180 may, in some embodiments, receive feedback regarding the position and/or processing efficacy of the beam relative to the workpiece from a feedback unit connected to suitable monitoring sensors. In response to signals from the feedback unit, the controller 180 may alter the path, BPP and/or shape of the beam via, e.g., movement of the input beam 110 to one or more different locations within an optical fiber in a fiber bundle 140. Embodiments of the invention may also incorporate aspects of the apparatus and techniques disclosed in U.S. patent application Ser. No. 14/639,401, filed on Mar. 5, 2015, U.S. patent application Ser. No. 15/261,096, filed on Sep. 9, 2016, and U.S. patent application Ser. No. 15/649,841, filed on Jul. 14, 2017, the entire disclosure of each of which is incorporated by reference herein.

In addition, the laser system may incorporate one or more systems for detecting the thickness of the workpiece and/or heights of features thereon. For example, the laser system may incorporate systems (or components thereof) for interferometric depth measurement of the workpiece, as detailed in U.S. patent application Ser. No. 14/676,070, filed on Apr. 1, 2015, the entire disclosure of which is incorporated by reference herein. Such depth or thickness information may be utilized by the controller to control the output beam BPP and/or shape to optimize the processing (e.g., cutting or welding) of the workpiece, e.g., in accordance with records in the database corresponding to the type of material being processed.

Figure 6:
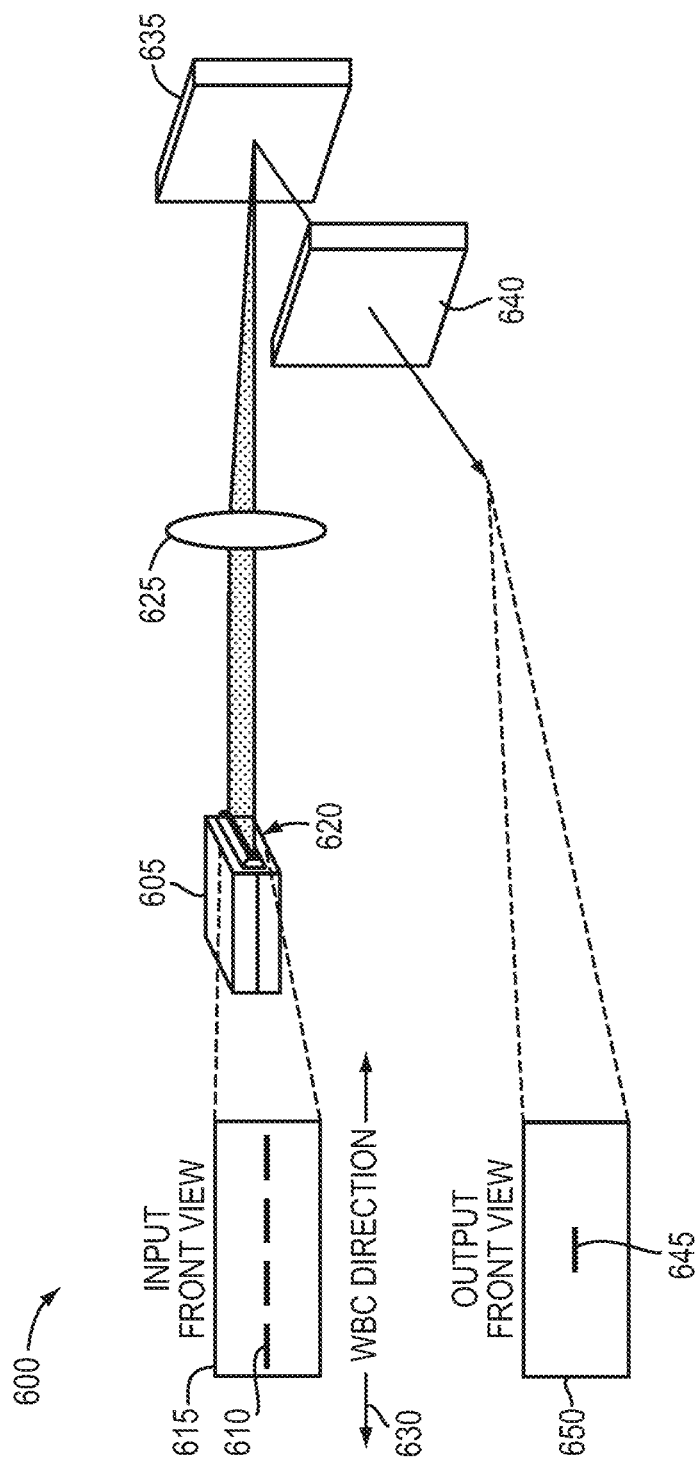
FIG. 6 is a schematic diagram of a wavelength beam combining laser system that may be utilized to supply the input beam for laser beam delivery systems in accordance with various embodiments of the invention.

Laser systems and laser delivery systems in accordance with embodiments of the present invention and detailed herein may be utilized in and/or with WBC laser systems. Specifically, in various embodiments of the invention, multi-wavelength output beams of WBC laser systems may be utilized as the input beams for laser beam delivery systems for variation of BPP and/or beam shape as detailed herein. FIG. 6 depicts an exemplary WBC laser system 600 that utilizes one or more lasers 605. In the example of FIG. 6, laser 605 features a diode bar having four beam emitters emitting beams 610 (see magnified input view 615), but embodiments of the invention may utilize diode bars emitting any number of individual beams or two-dimensional arrays or stacks of diodes or diode bars. In view 615, each beam 610 is indicated by a line, where the length or longer dimension of the line represents the slow diverging dimension of the beam, and the height or shorter dimension represents the fast diverging dimension. A collimation optic 620 may be used to collimate each beam 610 along the fast dimension. Transform optic(s) 625, which may include, consist essentially of, or consist of one or more cylindrical or spherical lenses and/or mirrors, are used to combine each beam 610 along a WBC direction 630. The transform optics 625 then overlap the combined beam onto a dispersive element 635 (which may include, consist essentially of, or consist of, e.g., a reflective or transmissive diffraction grating, a dispersive prism, a grism (prism/grating), a transmission grating, or an Echelle grating), and the combined beam is then transmitted as single output profile onto an output coupler 640. The output coupler 640 then transmits the combined beams 645 as shown on the output front view 650. The output coupler 640 is typically partially reflective and acts as a common front facet for all the laser elements in this external cavity system 600. An external cavity is a lasing system where the secondary mirror is displaced at a distance away from the emission aperture or facet of each laser emitter. In some embodiments, additional optics are placed between the emission aperture or facet and the output coupler or partially reflective surface. The output beam 645 is a thus a multiple-wavelength beam (combining the wavelengths of the individual beams 610), and may be utilized as the input beam in laser beam delivery systems detailed herein and/or may be coupled into an optical fiber.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of processing a plurality of workpieces, the method comprising:
   providing a fiber bundle comprising (i) a first optical fiber having (a) a first input end for receiving a laser beam and (b) opposite the first input end, a first output end for delivery of the laser beam to a first workpiece, and (ii) a second optical fiber having (a) for receiving the laser beam, a second input end proximate the first input end, and (b) opposite the second input end, a second output end for delivery of the laser beam to a second workpiece different from the first workpiece;
   directing the laser beam toward the first input end to process the first workpiece;
   there during, selecting at least one of a first beam parameter product or a first beam shape of the laser beam by directing the laser beam onto one or more first in-coupling locations on the first input end;
   directing the laser beam toward the second input end to process the second workpiece; and
   there during, selecting at least one of a second beam parameter product or a second beam shape of the laser beam by directing the laser beam onto one or more second in-coupling locations on the second input end.

2. The method of claim 1, wherein the at least one of the second beam parameter product or second beam shape is different from the at least one of the first beam parameter product or first beam shape.

3. The method of claim 1, wherein at least one characteristic of the first and second workpieces is different.

4. The method of claim 3, wherein the at least one characteristic comprises thickness and/or composition.

5. The method of claim 1, further comprising modulating an output power of the laser beam between directing the laser beam toward the first input end and directing the laser beam toward the second input end.

6. The method of claim 1, wherein an interior configuration of the first optical fiber is substantially identical to an interior configuration of the second optical fiber.

7. The method of claim 1, wherein at least one of the first in-coupling locations intersects a cladding region of the first optical fiber, beam energy coupled into the cladding region being utilized to process the first workpiece.

8. The method of claim 1, wherein at least one of the second in-coupling locations intersects a cladding region of the second optical fiber, beam energy coupled into the cladding region being utilized to process the second workpiece.

9. The method of claim 1, wherein directing the laser beam toward the first input end comprises at least one of (i) reflecting the laser beam with one or more reflectors or (ii) focusing the laser beam with one or more optical elements.

10. The method of claim 9, wherein directing the laser beam toward the second input end comprises at least one of (i) reflecting the laser beam with the one or more reflectors or (ii) focusing the laser beam with the one or more optical elements.

11. The method of claim 1, wherein a physical characteristic of the first optical fiber and the second optical fiber is different.

12. The method of claim 11, wherein the physical characteristic comprises a quantity of fiber cores, a quantity of cladding regions, a diameter of a fiber core, a thickness of a cladding region, a refractive index of a fiber core, and/or a refractive index of a cladding region.

13. The method of claim 1, wherein at least one of the first or second optical fibers comprises a multi-clad optical fiber comprising a fiber core, a first cladding region surrounding the fiber core, and a second cladding region surrounding the first cladding region.

14. The method of claim 13, wherein (i) a refractive index of the fiber core is larger than a refractive index of the first cladding region, and (ii) the refractive index of the first cladding region is larger than a refractive index of the second cladding region.

15. The method of claim 1, wherein at least one of the first or second optical fibers comprises a step-clad optical fiber comprising (i) a central core having a first refractive index, (ii) surrounding the central core, a first cladding having a second refractive index, (iii) surrounding the first cladding, an annular core having a third refractive index, and (iv) surrounding the annular core, a second cladding having a fourth refractive index, wherein (i) the first refractive index is larger than the fourth refractive index, (ii) the third refractive index is larger than the fourth refractive index, and (iii) the second refractive index is smaller than the first refractive index and larger than the fourth refractive index.

16. The method of claim 1, further comprising emitting the laser beam from a beam emitter comprising:
  one or more beam sources emitting a plurality of discrete beams;
  focusing optics for focusing the plurality of beams onto a dispersive element;
  a dispersive element for receiving and dispersing the received focused beams; and
  a partially reflective output coupler positioned to receive the dispersed beams, transmit a portion of the dispersed beams therethrough as the laser beam, and reflect a second portion of the dispersed beams back toward the dispersive element.

17. The method of claim 16, wherein the laser beam is composed of multiple wavelengths.

18. The method of claim 16, wherein the dispersive element comprises a diffraction grating.

19. The method of claim 1, wherein the first workpiece and the second workpiece are disposed at different workstations.

20. The method of claim 1, wherein the first input end and the second input end are coupled to a shared end cap.

* * * * *